United States Statutory Invention Registration [19]

[11] Reg. Number: H667

Bedair et al. [43] Published: Sep. 5, 1989

[54] PATTERNED TUNNEL JUNCTION

[75] Inventors: Salah M. Bedair, Raleigh; Robert J. Markunas, Chapel Hill; Michael L. Timmons, Raleigh; James A. Hutchby, Raleigh; John R. Hauser, Raleigh, all of N.C.

[73] Assignee: The United States of America as represented by the Secretary of the Air Force, Washington, D.C.

[21] Appl. No.: 49,359

[22] Filed: May 14, 1987

[51] Int. Cl.[4] ..... H01L 31/06

[52] U.S. Cl. ..... 136/249

[58] Field of Search ..... 136/249 TJ

[56] References Cited

U.S. PATENT DOCUMENTS

| | | | |
|---|---|---|---|
| 3,472,698 | 10/1969 | Mandelkorn | 136/256 |
| 4,106,047 | 8/1978 | Lindmayer | 136/255 |
| 4,289,920 | 9/1981 | Hovel | 136/246 |
| 4,292,461 | 9/1981 | Hovel | 136/249 |
| 4,316,049 | 2/1982 | Hanak | 136/244 |
| 4,332,974 | 6/1982 | Fraas | 136/249 |

OTHER PUBLICATIONS

"Patterned GE Tunnel Junctions As Cell Interconnects for Multijunction Monolithic Cascade Solar Cells" by P. K. Chiang, M. L. Timmons, G. G. Fountain and J. A. Hutchby, *Conference Record, 18th Photovoltaic Specialists Conf. (1985)*, pp. 562–567, published Apr. 1986.

*Primary Examiner*—John F. Terapane
*Assistant Examiner*—Eric Jorgensen
*Attorney, Agent, or Firm*—William G. Auton; Donald J. Singer

[57] ABSTRACT

A multijunction solar cell is disclosed which uses a patterned intercell ohmic connection as the tunnel junction to connect a top solar cell in electrical and optical series with a bottom solar cell. By confining this patterned tunnel junction to shadowed areas directly beneath the top surface metallization grid, the tunnel junction is set free from the requirement that it be transparent and have band gaps greater than or equal to those of the top solar cell.

1 Claim, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PATTERNED TUNNEL JUNCTION

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to a cascade multijunction solar cell construction.

Solar cells are photovoltaic devices which are capable of converting solar radiation into usable electrical energy. The energy conversion occurs as a result of the "photovoltaic effect". When solar radiation impinges on a solar cell, it is absorbed by the active region of the cell, causing electrons and holes to be generated. The electrons and holes are separated by the electric field resulting from the PN junction in the solar cell. The electric field is inherent in a semiconductor layer adjacent regions of P type, intrinsic, and N type GaAs semiconductors. Absorption of solar radiation of the appropriate wavelength produces electron-hole pairs in the collection region of the semiconductor layers. The separation of the electron-hole pairs, with the electrons flowing toward the region of N type conductivity, and the holes flowing toward the region of P type conductivity gives rise to the photovoltage and photocurrent of the cell.

The overall performance of the solar cell is maximized by increasing the total number of photons of differing energy which are absorbed by the semiconductor device. The task of expanding the range of the solar spectrum used by solar cells is alleviated, to some extent, by the systems of the following U.S. Patents, the disclosures of which are incorporated by reference:

U.S. Pat. No. 3,472,698 issued to Mandelkorn;
U.S. Pat. No. 4,106,047 issued to Lindmayer;
U.S. Pat. No. 4,289,920 issued to Hovel;
U.S. Pat. No. 4,292,461 issued to Hovel;
U.S. Pat. No. 4,316,049 issued to Hanak; and
U.S. Pat. No. 4,332,974 issued to Fraas.

The above-cited references all disclose state-of-the-art solar cell constructions. Of particular note is the Hanak reference which discloses a high voltage series connected tandem junction solar battery having one optical path and is electrically interconnected by a tunnel junction. The layers of silicon arranged in tandem configuration can have either the same or differing bandgaps. A cell "interconnecting layer" is situated between the active semiconductor layers. It provides a single electrical path through the active layers to the back contact. The cell "interconnecting layer" also permits the transmission of solar radiation which is not absorbed by the active region to the second active region or additional active region, where additional absorption can occur. Tunnel junctions for amorphous-crystalline tandem solar cells are also disclosed in the Hovel Pat. No. 4,292,461.

Fraas is concerned with a multijunction solar cell and Hovel U.S. Pat. No. 4,289,920 is directed to a multiple bandgap solar cell. Lindmayer shows a solar cell with a discontinuous junction.

In Mandelkorn a cover glass is metallized in a pattern which is identical to the top contact pattern of a shallow junction solar cell. The cover glass is then bonded to the cell only within the metallized regions of the glass and cell.

The multijunction solar cell systems cited above depict attempts in the art to select a choice of bandgaps which allow the solar cell constructions to efficiently utilize greater ranges of the incident solar spectrum. While these systems are instructive, the prior art cascade solar cells have four constraints placed on the design of the junction between solar cells which are joined in an electrical and optical series; these are as follows:

First, a cascade solar cell construction entails a top cell, a tunnel junction layer, and a bottom cell. In such a construct, the first constraint is that the bandgap of the tunnel junction layer must be equal to or greater than the bandgap of the top cell (for transparency). In the systems of the above-cited references, there is no escape from the first constraint in cascade solar cell constructions.

The second design constraint is that the lattice constant of the tunnel junction layer must match that of the rest of the cell. This design constraint is typical of all semiconductor constructs.

The third design constraint on cascade solar cell construction is that the doping concentrations and profile gradients must be large enough to be consistent with the required peak tunneling current density. Note how this third constraint is in a potential conflict with the first design constraint on the bandgap of the tunnel junction layer.

The fourth design constraint on cascade solar cell constructions is that the crystalline perfection of the doped tunnel junction epilayers must be sufficient to allow high quality epitaxy of the top cell epilayers, while avoiding reductions in the top cell lifetimes and diffusion lengths due to propagating defects orginating in the tunnel junction layers.

As described above, the design of cascade solar cells systems entails orchestrating the four design constraints to optimize the efficiency of the solar cell performance. However, the design of cascade solar cell constructions could be enhanced if the design could be set free from one of the four major constraints. In response to this, the present invention includes a cascade solar cell design that does not require a transparent tunnel junction. This design effectively decouples one of the major constraints (bandgap) from the tunnel junction criteria and greatly increases the design flexibility of the cascade solar cell.

SUMMARY OF THE INVENTION

The present invention is a cascade or multijunction solar cell construction in which two cells are joined by a patterned tunnel junction. This solar cell construction includes a monolithic two-terminal cascade structure with an as-grown (crystalline) interconnect joining the two cells in electrical and optical series. However the tunnel junction interconnect is not a continuous planar structure. Instead, the tunnel junction is confined to those areas of the cell shadowed by the top surface metallization grid.

By confining the tunnel junction to shadowed areas, the tunnel junction is set free from the transparency requirement which has limited prior art cascade solar cell constructs. In other words, the tunnel junction bandgaps, in the present invention, are not limited to values which are greater than or equal to the bandgap of the top solar cell. This freedom also reduces limitations on the doping concentrations and profile gradients for the tunnel junction and allows greater flexibility in cascade solar cell design.

It is an object of the present invention to provide a multijunction solar cell which uses a greater range of the incident solar spectrum than a single cell.

It is another object of the present invention to provide a multijunction solar cell construction in which the tunnel junction between solar cells is not required to be transparent.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is a multijunction solar cell construction in which two solar cells are joined by a patterned tunnel in a design which eliminates the constraint that the tunnel junction must be transparent.

Figure 1:
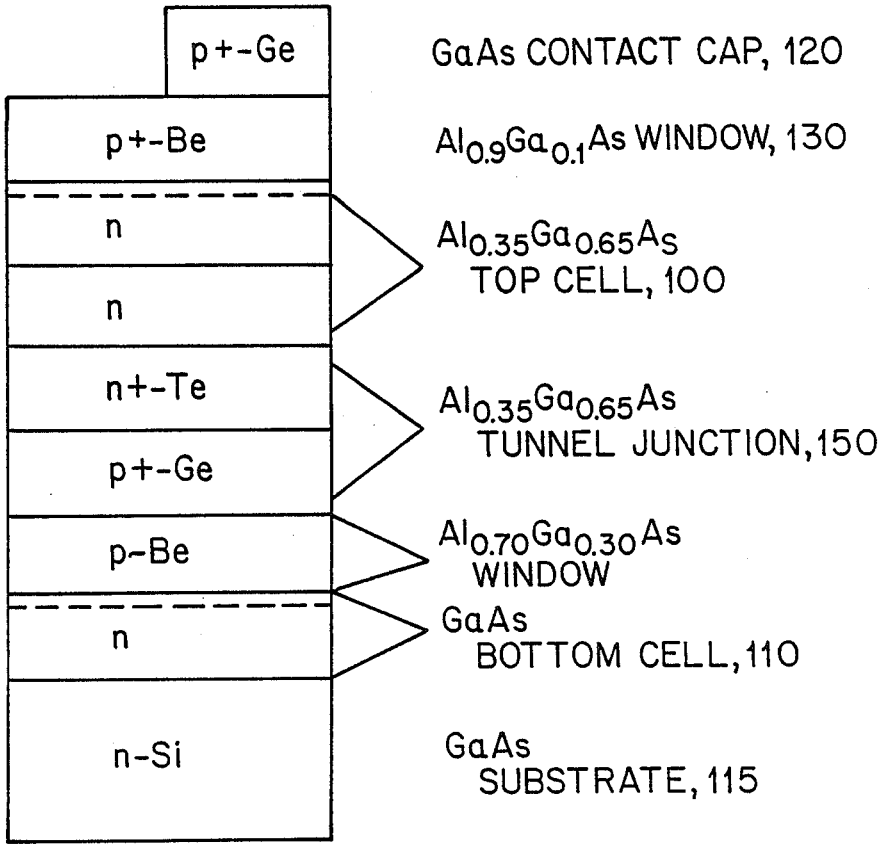
FIG. 1 PRIOR ART
FIG. 1 is an illustration of a prior are monolithic cascade solar cell construction.
Figure 2:
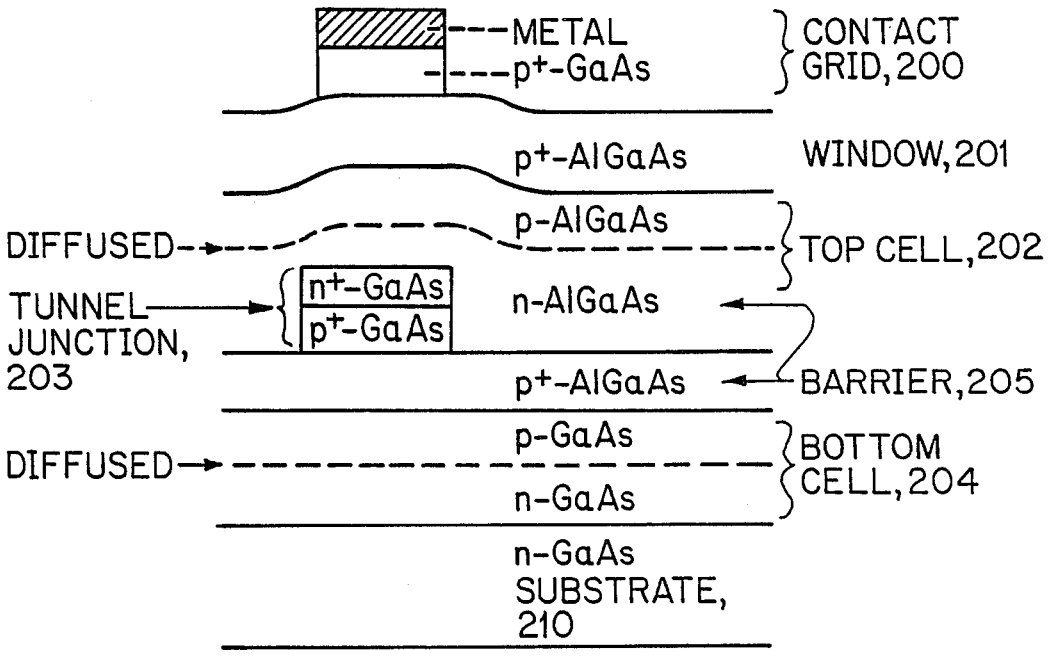
FIG. 2 is an illustration of an embodiment of the present invention.

In FIGS. 1 and 2, the following symbols are used: p, n, +, −, Te, Ge, Be, Si. Their meanings are as follows: The symbols p and n respectively designate acceptor and donor dopants which are used to dope the semiconductor material. The symbol + is only used with an acceptor dopant. The symbol − is used to separate the donor and acceptor designation from the semiconductor dopant chemical identification. The symbols Te, Ge, Be, and Si are the chemical symbols of: tellurium, germanium, beryllium, and silicon. Finally, the semiconductor substrate composition is identified at the side of each substrate level. For example, at the bottom of FIG. 1 is a silicon doped n type GaAs substrate where GaAs is the conventional designation for gallium arsenide.

The reader's attention is now directed towards FIG. 1 which depicts a prior art monolithic cascade solar cell construction. As depicted in FIG. 1, a cascade solar cell construction contains a top solar cell 100 whch is connected to a bottom solar cell 110 by a tunnel junction 150. The tunnel junction 150 serves to electrically and optically connect the top cell 100 to the bottom cell in a series circuit which allows the two cells to use a larger range of the solar spectrum than a single solar cell.

The semiconductor construct of FIG. 1 is fabricated On a GaAs substrate, 115 and has an electrical contact cap 120 on top. Solar energy passes through the window 130 through the top cell 100 and tunnel junction 150 before reaching the bottom cell 110. This higher energy light is absorbed by the top cell, 100 while the comparatively lower energy light passes through the window to the bottom cell 110. As mentioned earlier, in a cascade solar cell construction, such as FIG. 1, the bandgap of the tunnel junction 150 must be greater than or equal to the bandgap of the top cell 100 to satisfy the transparency requirement and allow the bottom cell 110 to function.

FIG. 2 is an illustration of an embodiment of the present invention. The cascade solar cell construction of FIG. 2 has a contact grid 200, a window 201, a top solar cell 202, a tunnel junction 203, and a bottom solar cell 204, all constructed on a substrate 210. However, the design of the construction of FIG. 2 eliminates the bandgap limits and transparency requirements of the tunnel junction as discussed below.

Figure 3:
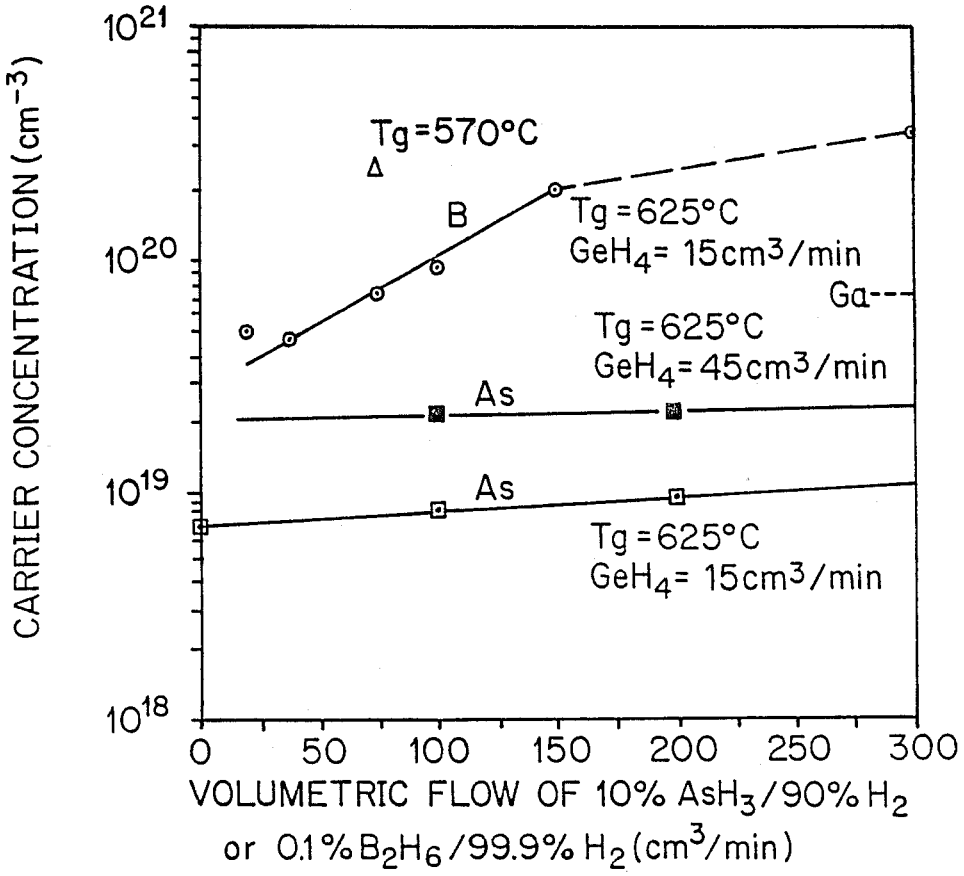
FIG. 3 is a chart depicting the doping characteristics of arsenic and boron in the semiconductor germanium as a function of $AsH_3$ and $B_2H_6$ flows respectively.

The tunnel junction 150 of FIG. 1 is a continuous planar structure and is typically used in conventional cascade solar cells. An example is depicted in the above-cited patent of Hovel. The tunnel junction 203 of the present invention is not a continuous planar structure. Instead, the present invention confines the tunnel junction 203 to those areas of the cell which are shadowed by the top surface contact grid 200. As shown in FIG. 3, this means that the tunnel junction is located directly beneath the metallization grid and like the metallization grid, has a width which is smaller than that of the top and bottom solar cells. Note that in FIG. 2, the tunnel junction is composed of GaAs, and has a band gap energy that approximately matches that of the top and bottom solar cells.

By confining the tunnel junction to shadowed areas, the tunnel junction is set free from the transparency requirement and bandgap limitations which have limited prior art solar cell constructs. This freedom also reduces the limits of the doping concentrations of the tunnel junction and allows greater flexbility in cascade solar cell design.

The present invention offers several advantages over prior art cascade systems. The top cell metallization grid 200 requires no more area than is required for a single junction cell. No additional active area is lost due to complex two-level metallizations. The patterned tunnel junction 203 is not required to be nonabsorbing of the radiation passed by the top cell since the tunnel junction is shaded by the metallization grid. The bandgap of the tunnel junction can then be reduced to optimize the electrical performance of the tunnel junction. It should be noted that the layers adjacent to the tunnel junction serve as minority carrier barriers. These layers 205 form a bandgap step which prevents minority carrier collection by the tunnel junction. Thus no photovoltage is produced in the tunnel junction either by direct absorption or by collection of minority carriers from adjacent regions.

As mentioned above, the use of a low bandgap material also allows increased doping concentrations in the tunnel junction, which increases the tunneling field and therefore the tunneling current. Additionally, the patterned-tunnel-function design can also lead to improved material quality in the top cell. This improvement has two contributions. First, higher dopant activation results in less total dopant incorporation for a given carrier concentration, and, second, the total volume of degenerately doped material is reduced by about 90% for a typical cell design. Thus, about 90% of the nucleation surface for the top cell is not degenerately doped material.

The present invention includes the process of fabricating patterned tunnel junction cascade solar cells. This fabrication process is accomplished in two growth sequences. First, the bottom cell, bottom cell window layer (minority carrier barrier), and tunnel junction layers are grown. Using photolithographic masking, the tunnel junction layers are etched to form the desired pattern. The upper minority carrier barrier layer, the top cell layers, and the top cell window layer are grown. Finally, the top cell metalaization grid is patterned to correspond to the underlying tunnel junction regions. As shown in FIG. 3, both the metallization grid and the tunnel junction have a predetermined width which is smaller than the width of the top and bottom solar cells. As mentioned above, this allows the tunnel junction to remain in those areas shadowed by the metallization grid, when received light has an angle of incidence which is normal to the solar cell construction. Note that in FIG. 3, the tunnel junction is composed of GaAs, and has a band gap energy that approximately matches that of the bottom and top solar cells. This means that the tunnel will not impede light from reaching the bottom solar cell when light is other than normal to the solar cell construction and shines on the tunnel junction itself. In other words, the system of FIG. 2 minimally impedes light from reaching the bottom solar cell.

The fabrication process described above is distinct from the conventional fabrication techniques in that it confines the tunnel junction to areas which are directly beneath the top cell metallization grid. Intercell ohmic connections (IOCs) place the multiple junctions of monolithic cascade solar cells in electrical and optical series. Various approaches to develop IOCs have been attempted by several laboratories and include: high bandgap tunnel junctions, laser fusion of top and bottom cells, thin germanium (Ge) layers and multilevel layers of metallization. All have met with only moderate success. High-bandgap tunnel junctions face a fundamental problem. It is extremely difficult to introduce impurity atoms with concentrations sufficiently large to keep the material degenerate, a requirement for low resistivity and tunnelling. Uniformity of the interface between cells is an unsolved problem with laser fusion. Thin Ge layers must be grown 75 angstroms thick to avoid excessive absorption losses. Multilevel metallization, besides producing three or four terminal devices, requires extensive photolithography and masking.

The present invention includes an IOC whidh combines the advantages of several of the earlier approaches but has few of the drawbacks. This approach is the patterned Ge IOC. Resistivity measurements show that this IOC is capable of providing the necessary connections for concentrator cells.

The initial development of the IOC of the present invention is intended for gallium arsenide (GaAs) and aluminum gallium arsenide (AlGaAs) solar cells. FIG. 2 shows the structure of the GaAs/AlGaAs cascade cell with a GaAs IOC. Ge has some very obvious advantages for GaAs based cells: the lattice mismatch between Ge and GaAs is small, about 0.08 percent, and the thermal coefficient of expansion is almost the same for the two materials. These factors favor the epitaxial growth of the mixed Ge/GaAs structures. However, growth of polar semiconductors (GaAs) on nonpolar ones (Ge) is complicated by antiphase domain formation if growth conditions are not optimized.

Ge has another characteristic which impacts the structure and processing. The bandgap is less than that of the GaAs bottom junction, and therefore, the tunnel juhction is patterned photolithographically to lie directly beneath the surface grid metallization and to contribute to additional shadowing (or absorption) losses with normal solar incidence. In addition, the layers of the Ge IOC are 0.1 $\mu$m thick, thus avoiding the need to grow ultrathin layers. Although lithography is involved in the pattern fabrication, process requirements are less critical than for multilevel metallization.

Incorporating impurities in Ge is easier than for GaAs (or materials with even higher bandgaps). Degenerate material is easily fabricating using any of a number of dopants: boron (B), Ga, and Al produce p-type behavior while As, phosphorus (P), and antimony (Sb) produce n-type behavior. The solid solubility of these impurities is greater than $1\times10^{19}$ $cm^{-3}$, all exceeding the effective densities of states for both the conduction and valence bands. Hence the major problem associated with high-bandgap tunnel junctions-keeping the material degenerately doped-need not be a limiting factor.

Device consideration for Ge tunnel junctions are equally as attractive as the materials properties. Current densities greater than 1400 A $cm^{-2}$ have been measured at voltage of 50 mV for good quality discrete Ge tunnel junctions. The specific resistivity for such a device is less than $3.6\times10^{-5}$ ohm-$cm^2$. Assuming 5 percent surface coverage by the tunnel junction, IOCs require specific resistivities of $1.7\times10^{-4}$ ohm-$cm^2$ or less.

A brief description of the germanium growth, with respect to the present invention, is presented below. This description includes the reactor operating conditions and characteristics of the selected dopants.

Pyrolysing germane ($GeH_4$), a standard chemical vapor technique, provides a convenient method for growing Ge. For the present invention, the growth takes place in a horizontal reactor operated at atmospheric pressure. The $GeH_4$ source is a 5 percent mixture diluted with pure hydrogen. Hydrogen is also used as the carrier gas, and flow rates have varied from 3 l/min to over 8 l/min. Higher flow rates provide optimum growth conditions, minimize a gas phase decomposition which has been reported and are a major factor in reducing growth temperatures to as low as 550° C.

Arsine ($AsH_3$) in the form of a 10-percent $H_2$-diluted mixture is the As source used for n-type impurity addition. Trimethylgallium (TMG) and diborane ($B_2H_6$) are the sources of the p-type dopants Ga and B, respectively. The doping characteristics of As and B are shown in FIG. 3. Using $AsH_3$, carrier concentrations reach 0.8 to $2\times10^{19}$ $cm^3$ at a growth temperture of 625° C. The insensitivity of the carrier concentration to the $AsH_3$ flow is explained by the As background which results from deposits within the reaction chamber. Increased $GeH_4$ flow produces faster growth and slightly greater As incorporation. Since the effective density of states in the conduction band of Ge is $1.04\times10^{19}$ $cm^{-3}$ these data show that the material is only marginally degenerate for the lower $GeH_4$ flow. At growth temperatures nearer 750° C., measured carrier concentrations are as much as a factor 4 greater. However, the major drawback with As is its diffusivity in Ge, and the higher growth temperature exacerbate this problem.

Boron has proved to be almost the optimum dopant. A 1000-ppm $B_2H_6$ source (diluted with $H_2$) has been used for doping. As shown in FIG. 3, measured hole concentrations reach almost $4\times10^{20}$ $cm^{-3}$. The effective density of states in the Ge valence band is $6.0\times10^{18}$ $cm^{-3}$, indicating that all the B-doped, p-type material is deeply degenerate. Also, data suggest that B does not diffuse appreciably at 625° C. This establishes the ideal situation for a tunnel junction dopant: degenerate material is easily produced with little tendency for dopant diffusion.

The growth temperature had a profound effect on device performance. In early research 750° C. was typically used. No evidence of band-to-band tunnelling was seen in any grown Ge devices although some reasonably low resistivities were measured. Analyses of resistivities indicate the junctions are broadened by diffusion of the dopants, principally the As. Therefore, lower temperatures for the Ge deposition are now being employed. Most work here has used 625° C., a temperature comparable with the GaAs bottom cell growth, but temperatures as low as 550° C. have been investigated to obtain quality GaAs overgrowth on the Ge and avoid antiphase domain formation.

The present invention can be implemented in a variety of materials. For example, using an AlGaAs top cell and a GaAs bottom cell, the patterned tunnel junction could be GaAs or Ge. Or, using a GaAsSb bottom cell and an AlGaAsSb top cell, a GaAsSb patterned tunnel junction could be used. It should be emphasized that these are only examples and this device design is not limited to these systems.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A cascade solar cell construction comprising:

a metallization contact which has a predetermined width and allows an output of electric current generated by said cascade solar cell contruction from incident solar energy, and which partially blocks light and produces a shadowed area beneath it;

a top solar cell fixed in a planar layer beneath said metallization contact, said top solar cell having a width larger than that of said metallization contact so that it can receive light, said top solar cell being constructed from materials selected from a group which consists of aluminum gallium arsenide, and gallium arsenide;

a bottom solar cell fixed in a planar layer beneath said top solar cell, said bottom solar cell having a width larger than that of said metallization contact so that is can receive light which passes through said top solar cell, said bdttom solar cell being contructed from material selected from a group which consists of aluminum gallium arsenide, and gallium arsenide; and a patterned tunnel junction fixed between said top and bottom solar cell to electrically and optically connect said top and bottom solar cells in series, said patterned tunnel junction being located directly beneath said metallization grid and having a width which is smaller than the widths of the top and bottom solar cells, and width of said tunnel junction approximately equalling said predetermined width of said metallization contact and thereby being confined to said shadowed area directly beneath said metallization contact when the light of the incident solar energy is from a source which is normal to the matallization grid, said patterned tunnel junction being composed of a top n-type layer of gallium arsenide and a bottom p-type layer of gallium arsenide said top and bottom gallium arsenide layers of said tunnel junction having a band gap energy that approximately matches that of said top and bottom solar cells so that the tunnel junction does not block the light from reaching the bottom solar cell when the light of the incident solar energy is from a source which is not normal to the metallization grid.

* * * * *